(12) United States Patent
Trefonas, III et al.

(10) Patent No.: US 11,121,190 B2
(45) Date of Patent: Sep. 14, 2021

(54) OPTOELECTRONIC DEVICE AND METHODS OF USE

(71) Applicants: Dow Global Technologies LLC, Midland, MI (US); Rohm and Haas Company, Philadelphia, PA (US); The Board of Trustees of the University of Illinois, Urbana, IL (US); Rohm and Haas Electronic Materials LLC, Marlborough, MA (US)

(72) Inventors: Peter Trefonas, III, Marlborough, MA (US); Kishori Deshpande, Freeport, TX (US); Trevor Ewers, Midland, MI (US); Edward Greer, Collegeville, PA (US); Jaebum Joo, Marlborough, MA (US); Bong Hoon Kim, Urbana, IL (US); Nuri Oh, Urbana, IL (US); Jong Keun Park, Marlborough, MA (US); Moonsub Shim, Urbana, IL (US); Jieqian Zhang, Marlborough, MA (US)

(73) Assignees: Dow Global Technologies LLC, Midland, MI (US); Rohm and Haas Company, Philadelphia, PA (US); The Board of Trustees of the University of Illinois, Urbana, IL (US); Rohm and Haas Electronic Materials LLC, Marlborough, MA (US)

( * ) Notice: Subject to any disclaimer, the term of this patent is extended or adjusted under 35 U.S.C. 154(b) by 19 days.

(21) Appl. No.: 16/086,862

(22) PCT Filed: Mar. 23, 2017

(86) PCT No.: PCT/US2017/023727
§ 371 (c)(1),
(2) Date: Sep. 20, 2018

(87) PCT Pub. No.: WO2017/165584
PCT Pub. Date: Sep. 28, 2017

(65) Prior Publication Data
US 2019/0172878 A1      Jun. 6, 2019

Related U.S. Application Data

(60) Provisional application No. 62/312,629, filed on Mar. 24, 2016.

(51) Int. Cl.
*H01L 51/50*      (2006.01)
*H01L 27/32*      (2006.01)
(Continued)

(52) U.S. Cl.
CPC ........ *H01L 27/3227* (2013.01); *G06F 3/0412* (2013.01); *G06F 3/0421* (2013.01);
(Continued)

(58) Field of Classification Search
CPC ......... H01L 27/3227; H01L 31/035218; H01L 31/173; H01L 33/06; H01L 51/426; H01L 51/502
See application file for complete search history.

(56) References Cited

U.S. PATENT DOCUMENTS 5,293,050 A * 3/1994 Chapple-Sokol ....... H01L 33/06
257/17

(Continued)

FOREIGN PATENT DOCUMENTS

DE          103 59 881 A1    7/2005
DE     10 2014 221525 A1    11/2015
(Continued)

OTHER PUBLICATIONS

International Search Report issued in corresponding PCT Application PCT/US2017/023727.

*Primary Examiner* — Cuong Q Nguyen
(74) *Attorney, Agent, or Firm* — Mintz Levin Cohn Ferris Glovsky and Popeo, P.C.; Peter F. Corless

(57) ABSTRACT

Provided is an optoelectronic device comprising an optoelectronic element and circuitry connected to the optoelectronic element, (Continued)

wherein the optoelectronic element comprises plural quantum dots or plural nanorods, and wherein the circuitry is configured to be capable of switching the optoelectronic element between a configuration in which the circuitry provides an effective forward bias voltage that causes the optoelectronic element to emit light and a configuration in which the circuitry provides an effective reverse bias voltage that causes the optoelectronic element to be capable of generating a photocurrent when light to which the optoelectronic element is sensitive strikes the optoelectronic element.

5 Claims, 9 Drawing Sheets

(51) Int. Cl.
  *G06F 3/042* (2006.01)
  *H01L 51/42* (2006.01)
  *G06F 3/041* (2006.01)

(52) U.S. Cl.
  CPC .......... *H01L 51/426* (2013.01); *H01L 51/502* (2013.01); *G06F 2203/04103* (2013.01); *G06F 2203/04109* (2013.01); *H01L 2251/564* (2013.01); *Y02E 10/549* (2013.01)

(56) References Cited

U.S. PATENT DOCUMENTS

| | | | |
|---|---|---|---|
| 2009/0079345 A1* | 3/2009 | Inuiya | H01L 27/288 313/523 |
| 2011/0140075 A1* | 6/2011 | Zhou | H01L 51/502 257/13 |
| 2012/0118368 A1 | 5/2012 | Huang et al. | |
| 2017/0005283 A1* | 1/2017 | Al-Ghamdi | H01L 51/4293 |
| 2017/0084776 A1* | 3/2017 | Gessner | H01L 27/3227 |

FOREIGN PATENT DOCUMENTS

| | | |
|---|---|---|
| EP | 2 778 124 A1 | 9/2014 |
| WO | 2005/081810 A2 | 9/2005 |
| WO | 2012/071107 A1 | 5/2012 |

* cited by examiner

OPTOELECTRONIC DEVICE AND METHODS OF USE

CROSS-REFERENCE TO RELATED APPLICATION

This application is a 35 U.S.C.§ 371 U.S. national entry of International Application PCT/US2017/023727, having an international filing date of Mar. 23, 2017, which claims under 35 U.S.C. § 119 the benefit of U.S. Provisional Application No. 62/312,629 filed on Mar. 24, 2016, which is incorporated herein by reference in its entirety. The contents of the foregoing applications are incorporated herein by reference in their entirety.

Some optoelectronic devices contain two or more optoelectronic elements. In some optoelectronic devices, one or more optoelectronic elements (emitting elements) are configured to emit light when a proper electric field is applied, while other optoelectronic elements (absorbing elements) are configured to generate current when struck by light that has wavelength in the appropriate wavelength range. It is often desirable that the absorbing elements respond to light that travels through space outside the device and then strikes the device. In such situations, it is undesirable for light emitted by an emitting element to travel along a path within the device itself and reach an absorbing element. Additionally, it is desired that absorbing elements respond quickly to generate photocurrent (i.e., with a short rise time) when struck by light.

US 2014/0036168 describes an array of organic light-emitting diodes, and the array can be used for light sensing as well as light emission functions. It is desired to provide an improved device in which light from an emitting diode does not reach an absorbing diode by traveling a path that lies entirely within the device. It is also desired to provide optoelectronic devices with improved rise times. The improved devices are desirably used for various purposes, including detection of objects external to the device; detection of light from a specific device such as a light pen or laser pointer; and creation of an image corresponding to a path traced by a light pen or laser pointer.

The following is a statement of the invention.

A first aspect of the present invention is a device comprising a light-emitting optoelectronic element and a photocurrent-generating optoelectronic element, wherein the device further comprises an opaque element that prevents light emitted by the light-emitting optoelectronic element from reaching the photocurrent-generating optoelectronic element via a pathway within the device.

A second aspect of the present invention is an optoelectronic device comprising an optoelectronic element and circuitry connected to the optoelectronic element,
  wherein the optoelectronic element comprises plural quantum dots or plural nanorods, and
  wherein the circuitry is configured to be capable of switching the optoelectronic element between a configuration in which the circuitry provides an effective forward bias voltage that causes the optoelectronic element to emit light and a configuration in which the circuitry provides an effective reverse bias voltage that causes the optoelectronic element to be capable of generating a photocurrent when light to which the optoelectronic element is sensitive strikes the optoelectronic element.

A third aspect of the present invention is a method of detecting the presence of an object in proximity to an optoelectronic device comprising
  (a) providing an optoelectronic device comprising a light-emitting optoelectronic element and a photocurrent-generating optoelectronic element,
    wherein the device is configured so that some light emitted by the light-emitting optoelectronic element exits the optoelectronic device,
    wherein the device is configured so that light emitted by the light-emitting optoelectronic element that exits the optoelectronic device and is scattered or reflected by an external object could strike the photocurrent-generating optoelectronic element,
  (b) imposing an effective forward bias voltage on the light-emitting optoelectronic element and an effective reverse bias voltage on the photocurrent-generating optoelectronic element,
  (c) bringing an object capable of scattering or reflecting light or a combination thereof to a distance of 0.1 to 5 mm from a point on the surface of the optoelectronic device from which light emerges, causing light that is emitted by the light-emitting optoelectronic element to be reflected or scattered so that the light falls upon the photocurrent-generating optoelectronic element.

A fourth aspect of the present invention is a method of detecting the presence of an object in proximity to an optoelectronic device comprising
  (a) providing an optoelectronic device comprising a photocurrent-generating optoelectronic element, in an environment in which external light that originates outside the optoelectronic device falls upon the optoelectronic device,
  (b) imposing an effective reverse bias voltage on the photocurrent-generating optoelectronic element, wherein the external light of appropriate wavelength and of sufficient intensity to cause the photocurrent-generating optoelectronic element to generate photocurrent, and
  (c) bringing an opaque object to a distance of 0.1 to 5 mm from a point on the surface of the optoelectronic device, causing the opaque object to block enough of the external light to cause a detectable reduction in the photocurrent generated by the photocurrent-generating optoelectronic element.

A fifth aspect of the present invention is a method of creating an image on an array of optoelectronic elements comprising
  (a) providing a device comprising an array of optoelectronic elements and circuitry connected to each optoelectronic element,
    wherein the optoelectronic element comprises plural quantum dots or plural nanorods, and
    wherein the circuitry is configured to be capable of switching each optoelectronic element independently between a configuration in which the circuitry provides an effective forward bias voltage that causes the optoelectronic element to emit light and a configuration in which the circuitry provides an effective reverse bias voltage that causes the optoelectronic element to be capable of generating a photocurrent when light to which the optoelectronic element is sensitive strikes the optoelectronic element,
  (b) imposing an effective reverse bias on two or more of the optoelectronic elements,
  (c) providing circuitry that will detect the onset of photocurrent from an individual effective reverse biased optoelectronic element and that will respond to the photocurrent by changing the bias on the individual optoelectronic element to an effective forward bias.

The following is a brief description of the drawings.

Figure 1:
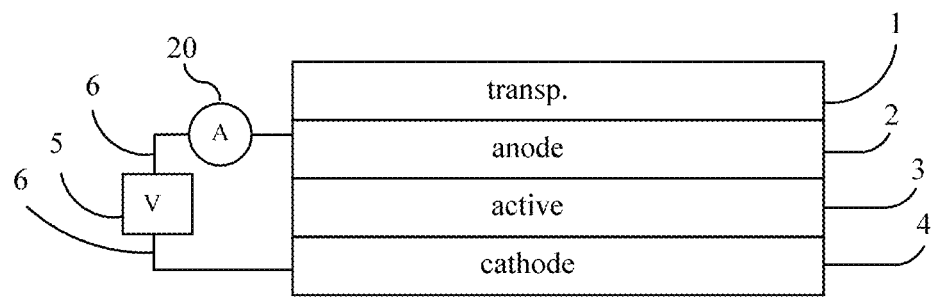
FIG. 1 is a schematic drawing of an optoelectronic element, which may be a light-emitting optoelectronic element ("LEOE") or a photocurrent-generating optoelectronic element ("PGOE").

The following is a detailed description of the invention.

As used herein, the following terms have the designated definitions, unless the context clearly indicates otherwise.

"Absorption layer" and like terms is a layer located between electrodes (anode and cathode) and when exposed to light of appropriate wavelength will create holes and electrons, which separate from each other to form a current if an appropriate effective reverse bias electric field is present.

"Active layer" and like terms is a layer located between electrodes (anode and cathode). An active layer may be an absorption layer or an emission layer or a layer that is capable of acting as either an absorption layer or emission layer depending on the bias voltage.

The "anode" injects holes into a layer located on the hole emitting layer side, such as the hole injection layer, the hole transport layer, or the emitting layer. The anode is disposed on a substrate. The anode is typically made from a metal, a metal oxide, a metal halide, an electroconductive polymer, and combinations thereof.

Each active layer is characterized by a band gap. The band gap of an emitting layer is characterized by putting the optoelectronic element under effective forward bias and measuring the intensity of the emitted light as a function of optical frequency. The frequency of light corresponding to the maximum intensity of emitted light is herein called $v_e$, and $v_e$ characterizes the band gap of the emitting layer. The band gap of a photocurrent-generating layer is characterized by putting the optoelectronic element under effective reverse bias, exposing the optoelectronic element to various frequencies of light, and measuring the photocurrent as a function of optical frequency. The frequency of light corresponding to the maximum photocurrent is herein known as the characteristic response frequency $v_d$ of the photocurrent-generating layer, and $v_d$ characterizes the band gap of the photcurrent-generating layer.

The "cathode" injects electrons into a layer located on the emitting layer side (that is, the electron injection layer, electron transport layer, or the emitting layer). The cathode is typically made from a metal, a metal oxide, a metal halide, an electroconductive polymer, or a combination thereof.

"Effective forward bias" is a voltage applied to the anode and cathode of an optoelectronic element. A "forward bias" voltage means that the voltage applied to the anode is positive relative to the voltage applied to the cathode. A forward bias is "effective" when the voltage has sufficient magnitude to cause the optoelectronic element to emit light.

"Effective reverse bias" is a voltage applied to the anode and cathode of an optoelectronic element. An effective reverse bias allows the optoelectronic element to generate a photocurrent when the optoelectronic element is struck by light to which it is sensitive. In general, an absolute reverse bias means that the voltage applied to the anode is negative relative to the voltage applied to the cathode. Most photocurrent-generating optoelectronic elements are capable of generating photocurrent when struck by light to which they are sensitive when they are under a reverse bias or when there is zero bias voltage. Many photocurrent-generating optoelectronic elements are also capable of generating photocurrent when struck by light to which they are sensitive when they are under a forward bias of relatively small magnitude. Thus an effective reverse bias is, for many optoelectronic elements, a voltage that falls in a range that spans from a small-magnitude forward bias through zero voltage and through a moderate-magnitude absolute reverse bias.

"Electron injection layer," or "EIL," and like terms is a layer that, in an optoelectronic element under an effective forward bias, efficiently injects electrons injected from the cathode into the electron transport layer. Some optoelectronic elements have an EIL and some do not.

"Electron transport layer," or "ETL," and like terms is a layer disposed between the active layer and the electron injection layer. When placed in an effective forward bias electric field, the electron transport layer transports electrons injected from the cathode toward the emitting layer. The material or composition of the ETL typically has a high electron mobility for efficiently transporting injected electrons. An ETL also typically tends to block the passage of holes.

"Electron Volt" or "eV" is the amount of energy gained (or lost) by the charge of a single electron moved across an electric potential difference of one volt.

"Emission layer" and like terms, is a layer located between electrodes (anode and cathode) and when placed in an effective forward bias electric field is excited by the recombination of holes injected from the anode through the hole injection layer with electrons injected from the cathode through the electron transport layer, the emission layer being the primary light-emitting source.

As used herein, "external light" is light that originates outside of the optoelectronic device of the present invention.

F4TCNQ is 2,3,5,6-tetrafluoro-7,7,8,8-tetracyano-p-quinodimethane.

As used herein, a "heterojunction" is a surface that is an interface between two different semiconductors.

"Hole injection layer," or "HIL," and like terms is a layer that, in an optoelectronic element under an effective reverse bias, efficiently injects holes injected from the anode into the hole transport layer. Some optoelectronic elements have an HIL and some do not.

"Hole transport layer (or "HTL")," and like terms, refers to a layer made from a material, which transports holes. High hole mobility is desirable. The HTL is used to help block passage of electrons transported by the emission layer. Small electron affinity is typically required to block electrons. The HTL should desirably have larger triplets to block exciton migrations from an adjacent EML layer.

As used herein, a "nanorod" (NR) is an article having a first axis. The nanorod has rotational symmetry about the first axis. The ratio of the length of the nanorod in the direction of the first axis (the "axial length") to the length of the nanorod in any direction perpendicular to the first axis is 2:1 or greater. The axial length of the nanorod is 200 nm or smaller. The nanorod contains two or more different semiconductors. A "double heterojunction nanorod (DHNR) is a nanorod with two or more different heterojunctions.

The term "opaque" as used herein refers to an article that transmits 1% or less of the light energy in the visible spectrum. An opaque article may prevent transmission of light by any mechanism, including absorption, scattering, reflection, or a combination thereof.

As used herein, an "optoelectronic element" is an article that is either a light-emitting optoelectronic element (also called a light-emitting diode (LED)), or a photocurrent-generating optoelectronic element (also called a photodiode (PD)). An LED is an article that will emit light when an appropriate voltage (the "effective forward bias" voltage) is applied. A PD is an article that will generate an electrical current when light of a wavelength to which the PD is sensitive strikes the PD at a time when an appropriate voltage (the "effective reverse bias" voltage) is applied. Some articles are capable of emitting light under an effective forward bias voltage and are also capable of generating photocurrent when struck by light of certain wavelengths while a reverse voltage is applied. That is, some articles can function as an LED or as a PD, depending on the voltage that is applied. An optoelectronic element that has an applied effective forward bias voltage and is emitting light is said herein to be in "emission mode" or "LED mode." An optoelectronic element that has an applied effective reverse bias voltage and is capable of generating photocurrent when struck by light of a wavelength to which the optoelectronic element is sensitive is said herein to be in "detection mode" or "PD mode."

PEDOT:PSS is a mixture of poly(3,4-ethylenedioxythiophene) and polystyrene sulfonate.

As used herein, an "organic" compound is a compound that contains one or more carbon atom. The term "organic compounds" does not include the following: binary compounds of carbon with any element other than hydrogen; metallic cyanides; metallic carbonyls, phosgene, carbonyl sulfide, and metallic carbonates. Compounds that are not organic are inorganic. Pure elements are considered herein as inorganic compounds.

As used herein, a "quantum dot" (QD) is an article having diameter of 1 to 25 nm. A quantum dot contains one or more inorganic semiconductor.

The "substrate" is a support for the organic light-emitting device. Nonlimiting examples of material suitable for the substrate include quartz plate, glass plate, metal plate, metal foil, plastic film from polymeric resins such as polyester, polymethacrylate, polycarbonate, and polysulfone.

TFB is poly (9,9-di-n-octylfluorene-alt-(1,4-phenylene-((4-sec-butylphenyl)imino)-1,4-phenylene.

FIG. 1 shows a schematic of an optoelectronic element. The layers are in contact with each other as shown in FIG. 1. The transparent layer 1 may be any transparent material. Preferred transparent material is glass. The transparent material is often referred to as "substrate," because a preferred method of constructing an optoelectronic element is to begin with a layer of glass and then apply the other layers in order. The anode layer 2 is preferably also transparent. A preferred material for anode layer 2 is indium tin oxide (ITO). The active layer 3 contains a material that is capable of emitting light when subjected to an appropriate "forward" bias voltage or that is capable of generating a photocurrent when exposed to light of an appropriate wavelength and when subjected to an appropriate "reverse" bias voltage or that is capable of either emitting light or generating a photocurrent, depending on the bias voltage. Bias voltage is applied by a voltage source or circuit 5. The cathode layer 4 is preferably metal. When it is desired to operate the optoelectronic element, a voltage source or circuit 5 is optionally connected to the anode layer and the cathode layer via wires 6. The connection between the voltage source 6 and the optoelectronic element may optionally be established and/or interrupted by a switch or a switching circuit (not shown). The electrical circuit shown in FIG. 1 preferably contains a current sensing device 20, which may be located at any point in the circuit.

When it is desired to provide an effective forward bias on the optoelectronic element, the voltage source or circuit applies a voltage to the anode 2 and the cathode 4 such that the voltage applied to anode 2 is positive relative to the voltage applied to the cathode 4. The magnitude of the applied voltage is at least large enough to cause the active layer 3 to emit light. Typical magnitude of the applied voltage for effective forward bias is 1 to 10 volts.

When it is desired to provide an effective reverse bias on the optoelectronic element, the voltage source or circuit applies a voltage to the anode 2 and the cathode 4 such that the voltage applied to anode 2 is negative relative to the voltage applied to the cathode 4. The magnitude of the applied voltage is at least large enough so that when light to which the active layer 3 is sensitive falls on the active layer 3, a photocurrent is generated. The magnitude of the applied voltage is kept low enough to avoid breakdown in the active material and the constant current flow that would result from breakdown. Typical magnitude of the applied voltage for effective reverse bias is −0.1 to 10 volts (i.e., from a small forward bias of magnitude 0.1 volt, through zero volts, to an absolute reverse bias of magnitude 10 volts). When photocurrent is generated, it is preferably detected by the current detector 20, which is optionally connected to additional processing circuits (not shown).

In some embodiments, the voltage source or circuit 5 contains control circuitry that is capable of applying either effective forward bias or effective reverse bias to the optoelectronic element. In some embodiments, the control circuitry flips the bias from forward to reverse and/or from reverse to forward; such flips may be controlled for example, by a time sequence or by a response to a stimulus that originates either outside of the optoelectronic device or that originates within the control circuitry.

Figure 2:
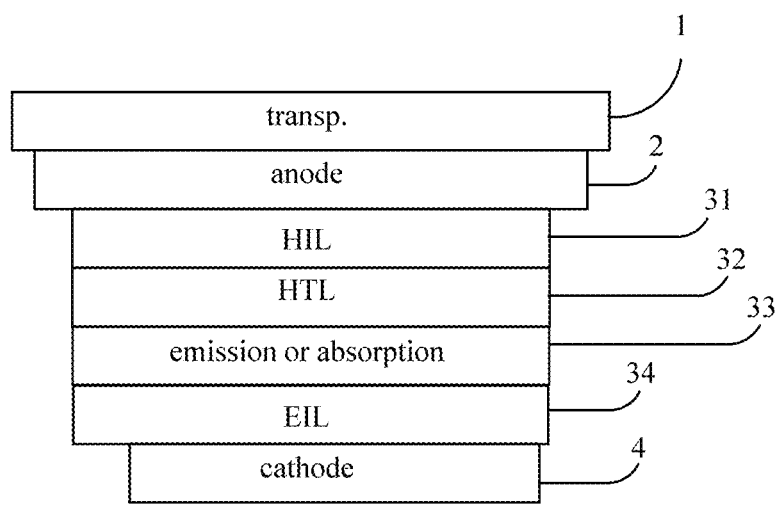
FIG. 2 is a schematic of one embodiment of an optoelectronic element.

FIG. 2 shows a schematic of one embodiment of an optoelectronic element. In FIG. 2, the active layer contains a hole injection layer (HIL) 31, a hole transport layer (HTL) 32, an active layer 33, and an electron injection layer (EIL) 34. Optionally, the optoelectronic element could also contain additional layers, including, for example, one or more of the following: one or more additional HIL adjacent to HIL 31; and/or one or more electron transport layer (ETL) adjacent to the emission or absorption layer and adjacent to an EIL.

The emission or absorption layer 33 may be any active optoelectronic material. For example, the emission or absorption layer 33 may contain two or more doped or undoped inorganic semiconductors to form one or more heterojunction; the inorganic semiconductors may be arranged in layers or in the form of plural particles. Preferably, the emission or absorption layer 33 contains plural inorganic particles, each of which contains one or more heterojunction. Preferably, the plural inorganic particles are quantum dots or nanorods. For another example, the emission or absorption layer 33 may contain an electroluminescent organic molecule or blend of two or more organic molecules.

Among quantum dots, preferred are those containing a Group II-VI material, a Group III-V material, a Group IV material, a Group V material, or a combination thereof. The quantum dot preferably includes one or more selected from CdS, CdSe, CdTe, ZnS, ZnSe, ZnTe, HgS, HgSe, HgTe, GaN, GaP, GaAs, InP and InAs. Preferably, the quantum dot includes two or more of the above materials. For instance, the compound may include two or more quantum dots existing in a simply mixed state, a mixed crystal in which two or more compound crystals are partially divided in the same crystal e.g. a crystal having a core-shell structure or a gradient structure, or a compound including two or more nanocrystals. Preferably, the quantum dot has an encased structure with a core and one or more shell encasing the core, where the composition of the core is different from the composition of the shell. In such embodiments, the core preferably includes one or more materials selected from CdSe, CdS, ZnS, ZnSe, CdTe, CdSeTe, CdZnS, PbSe, AgInZnS, and ZnO. The shell preferably includes one or more materials selected from CdSe, ZnSe, ZnS, ZnTe, CdTe, PbS, TiO, SrSe, and HgSe. In some embodiments, the quantum dot contains a core, a first shell surrounding the core, and a second shell surrounding the first shell. When present, the second shell preferably includes one or more materials selected from Cds, CdSe, ZnSe, ZnS, ZnTe, CdTe, PbS, TiO, SrSe, HgSe, alloys of Group II-IVs; more preferably selected from Cds, CdSe, ZnSe, ZnS, ZnTe, CdTe, PbS, TiO, SrSe, and HgSe. When a second shell is present, preferably the core, the first shell, and the second shell have three different compositions. In some embodiments, the quantum dot can comprise one or more atoms of a dopant element, such as Mn, Cu and Ag. In this case the dopant atom or atoms can be located in the core, or within the first shell of the quantum dot.

Preferred quantum dots have organic ligands attached to the outer surface. Preferred ligands contain hydrocarbon chains, preferably with 8 to 25 carbon atoms. The ligand preferably attaches to the outermost surface of inorganic semiconductor through a chemical group involving atoms other than carbon and hydrogen, for example a carboxyl group.

Figure 9:
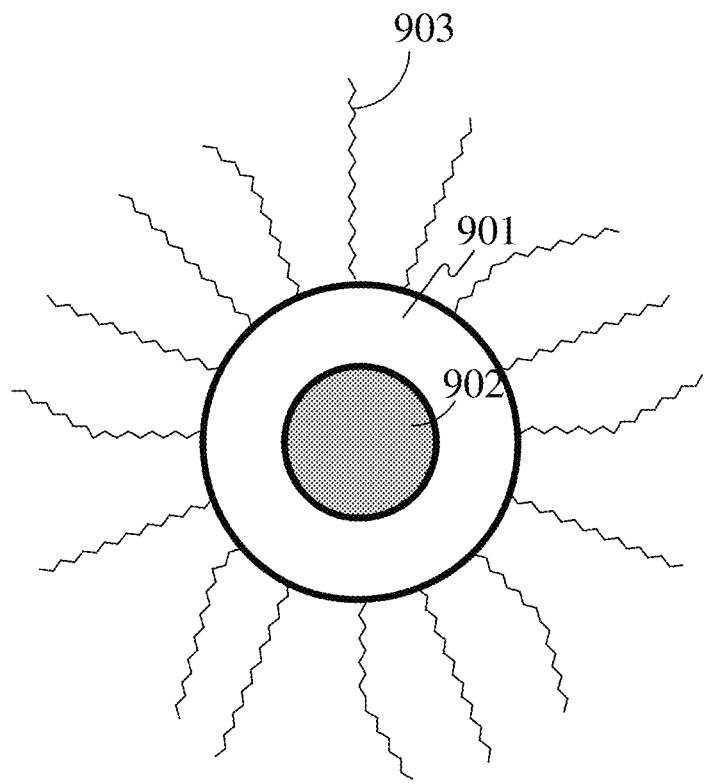
FIG. 9 is a schematic sketch of a core/shell quantum dot.

A preferred embodiment of a quantum dot is shown in FIG. 9. An inorganic semiconductor core 902 is surrounded by a different inorganic semiconductor 901. Organic ligand molecules 903 are attached to the surface of the outermost shell semiconductor 901.

Among nanorods, the ratio of the axial length of the nanorod to the length of the nanorod in any direction perpendicular to the first axis is 2:1 or greater; preferably 5:1 or greater; more preferably 10:1 or greater. The axial length of the nanorod is 200 nm or smaller; preferably 150 nm or smaller; more preferably 100 nm or smaller. The nanorod contains two or more different semiconductors. Preferable nanorods contain a cylindrical rod that has disposed at each end a single endcap or a plurality of endcaps that contact the cylindrical rod. The endcaps at a given end of the cylindrical rod also contact each other. The endcaps preferably serve to passivate the one-dimensional nanoparticles. Preferably, at each end of the cylindrical rod, the nanorod contains a first endcap and a second endcap that partially or completely surrounds the first endcap. The first endcap and the second endcap preferably have different compositions from each other. Preferably, each endcap contains one or more semiconductors. Preferably the cylindrical rod contains a semiconductor. Preferably the composition of the cylindrical rod is different from both the composition of the first endcap and the composition of the second endcap. The nanorods preferably comprise semiconductors that include those of the group II-VI (ZnS, ZnSe, ZnTe, CdS, CdSe, CdTe, HgS, HgSe, HgTe, and the like) and III-V (GaN, GaP, GaAs, GaSb, InN, InP, InAs, InSb, AlAs, AlP, AlSb, and the like) and IV (Ge, Si, Pb and the like) materials, and an alloy thereof, or a mixture thereof.

Figure 8:
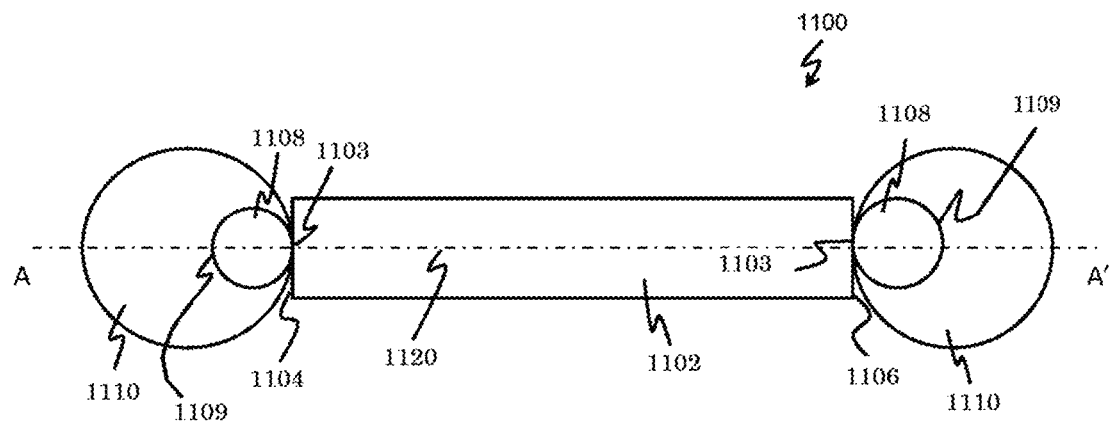
FIG. 8 is a schematic sketch of a nanorod.

A preferred nanorod is illustrated in FIG. 8. The nanorod 1100 comprise a cylindrical rod 1102 that has a first end 1104 and the second end 1106. The first endcap 1108 is disposed at the first end 1104 and the second end 1106 of the cylindrical rod and directly contacts the cylindrical rod 1102. The interface between the first endcap 1108 and the first end 1104 of the cylindrical rod forms a first heterojunction 1103. Preferably, the first endcap 1108 contacts the ends of the cylindrical rod 1102 and does not contact the longitudinal portion of the cylindrical rod 1102. It is preferable that the first endcap 108 does not surround the entire cylindrical rod 1102.

The second endcap 1110 contacts the first endcap 1108 and surrounds the first endcap 1108 at one or both ends of the cylindrical rod 1102. The second endcap 1110 may partially or fully surround the first endcap 1108. It is preferable that the second endcap 1110 does not surround the entire cylindrical rod 1102.

The interface between the second endcap 1110 and the first endcap 1108 forms the second heterojunction 1109. The nanorod 1100 in the FIG. 8 is therefore a double heterojunction nanoparticle. In the event that more endcaps are disposed on the second endcap 1110, the nanoparticle 1100 would have more than 2 heterojunctions. In an exemplary embodiment, the nanoparticle 1100 may have 3 or more heterojunctions, preferably 4 or more heterojunctions, or preferably 5 or more heterojunctions.

Preferably, the heterojunction at which the cylindrical rod contacts the first endcap has a type I or quasi-type II band alignment. Preferably, the point at which the second endcap contacts the first endcap has a type I or quasi-type II band alignment.

Figure 3:
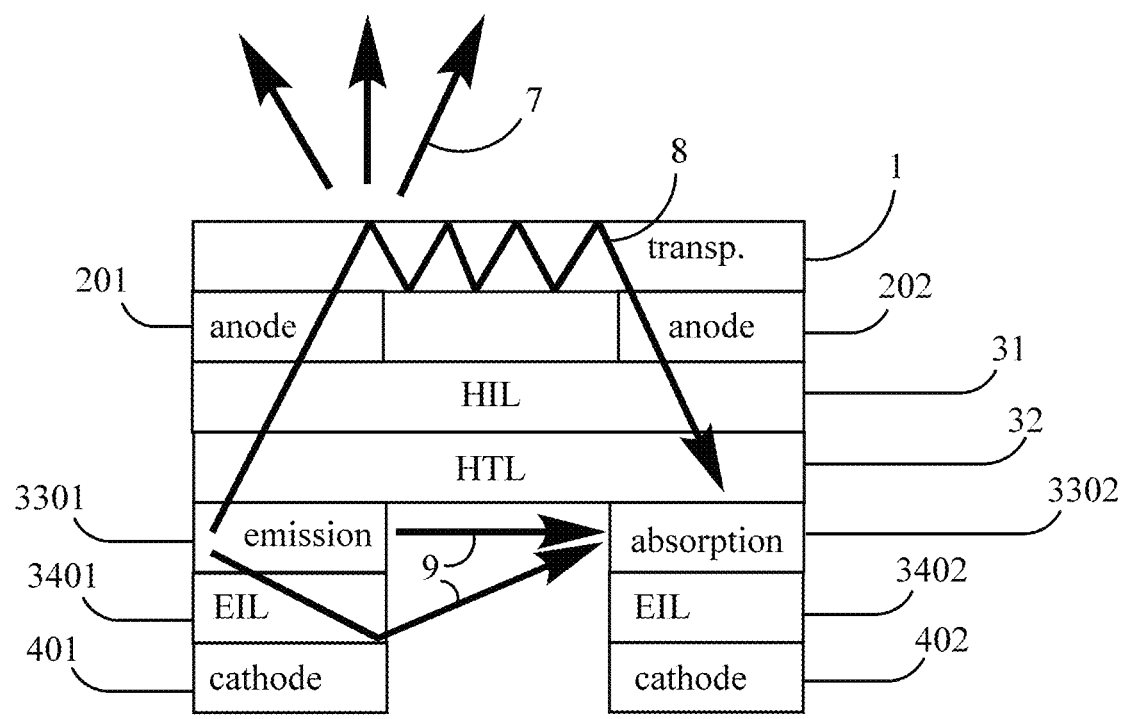
FIG. 3 shows one embodiment of a device having two adjacent optoelectronic elements, showing some possible light paths within the device.

FIG. 3 shows a schematic cross section of an optoelectronic device that contains plural optoelectronic elements. Such a device optionally contains more than two optoelectronic elements. Preferably the device contains a planar array of multiple optoelectronic elements. For example, additional optoelectronic elements could be present, arranged in a line in the plane of the drawing of FIG. 3, and each of those optoelectronic elements could be part of a line of optoelectronic elements that was perpendicular to the plane of the drawing of FIG. 3.

In FIG. 3, one optoelectronic element contains cathode 401, EIL 3401, emission layer 3301, HTL 32, HIL 31, anode 201, and transparent layer 1. Emission layer 3301 is labeled as "emission" to denote that an effective forward bias voltage has been applied to cathode 401 and anode 201, to cause the emission layer to emit light. The effective forward bias voltage is supplied by a circuit not shown in FIG. 3. In FIG. 3, the other optoelectronic element contains cathode 402, EIL 3402, absorption layer 3302, HTL 32, HIL 31, anode 202, and transparent layer 1. Absorption layer 3302 is labeled as "absorption" to denote that an effective reverse bias voltage has been applied to cathode 402 and anode 202, to cause the absorption layer to absorb light and generate a photocurrent. The effective reverse bias voltage is supplied by a circuit not shown in FIG. 3.

Also shown in FIG. 3 are possible paths 8, and 9 that, it is contemplated, light could take within the device to travel from the emission layer to the absorption layer. Path 9 is considered to lie within the device because the distance between optoelectronic elements is preferably small (less than 1 mm) and therefore external objects are not likely to be present in the gap between the emission layer 3301 and the absorption layer 3302. Three paths 7 show light exiting from the device.

Figure 4:
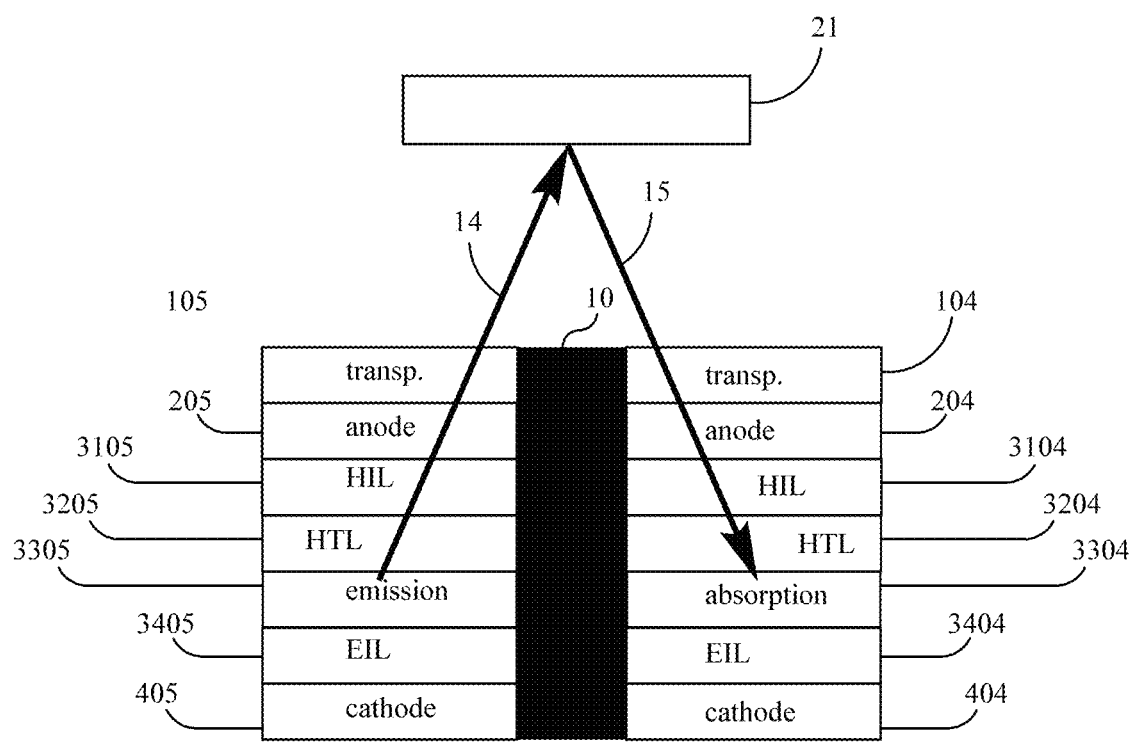
FIG. 4 shows an external object and one embodiment of a device with an opaque element an external object.

FIG. 4 shows an embodiment of an optoelectronic device similar to that shown in FIG. 3, except that in the embodiment shown in FIG. 4, each pair of adjacent optoelectronic elements is separated from its neighbor by an opaque element 10. As shown in FIG. 4, in this embodiment, the HTL is separated into HTL 3205 for the light-emitting optoelectronic element and HTL 3204 for the photocurrent-generating optoelectronic element. Also as shown in FIG. 4, in this embodiment, the HIL is separated into HIL 3105 for the light-emitting optoelectronic element and HIL 3104 for the photocurrent-generating optoelectronic element.

The opaque element 10 may be made from any opaque material. Some suitable materials are polymeric, optionally containing one or more filler, such as, for example, carbon black. On suitable material is KAPTON™ B polyimide black film (from DuPont).

Also shown in FIG. 4 is a path 14 that light could take from the emission layer to the atmosphere outside of the device. FIG. 4 depicts a situation in which an external object 21, located external to the device, reflects or scatters light, and some of the light returns via path 15 to the device, where it strikes the absorption layer, which generates photocurrent in response. It is considered that the opaque element 10 blocks light from traveling along a path within the device from the emission layer to the absorption layer.

Figure 5:
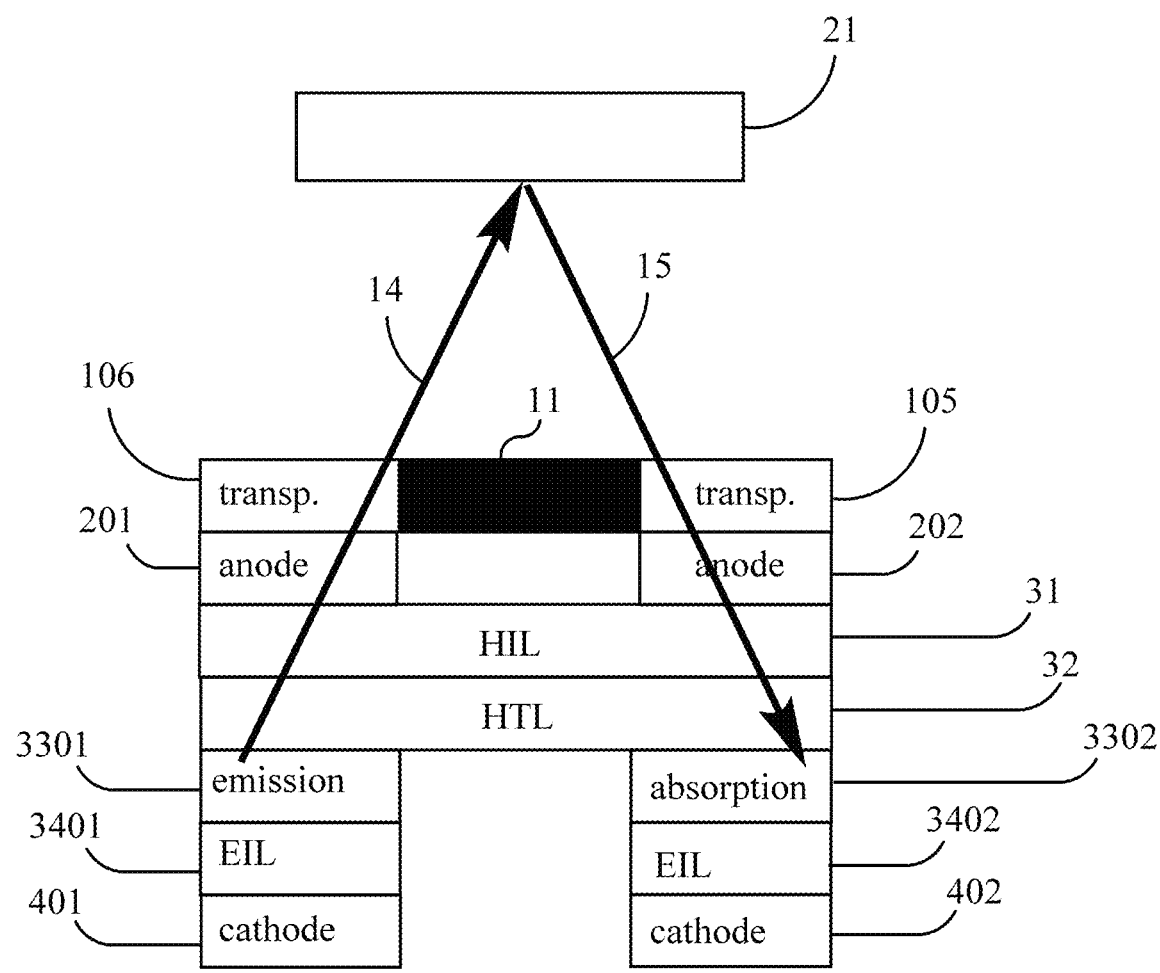
FIG. 5 shows an external object and another embodiment of a device with an opaque element.
Figure 6:
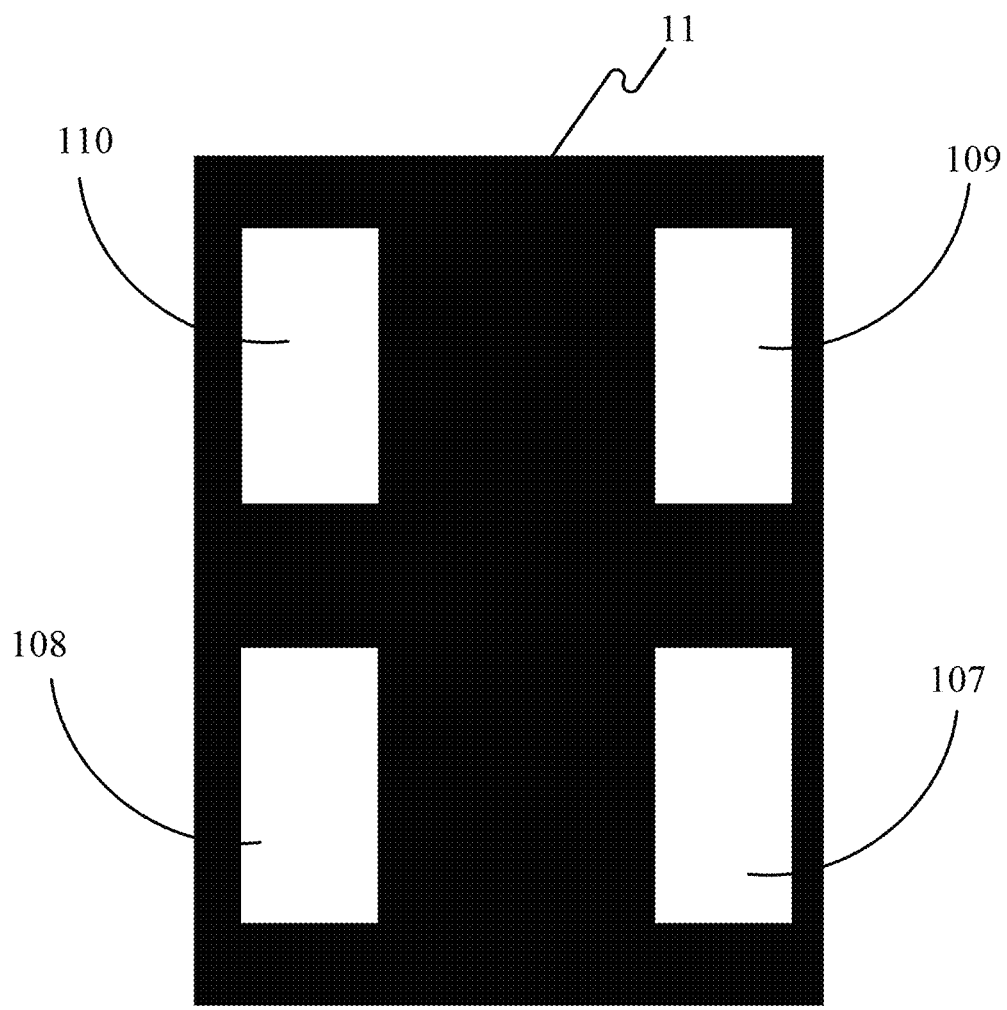
FIGS. 6 and 7 show two views of an embodiment of an opaque element that could be used in a device that contains an array of optoelectronic elements.
Figure 7:
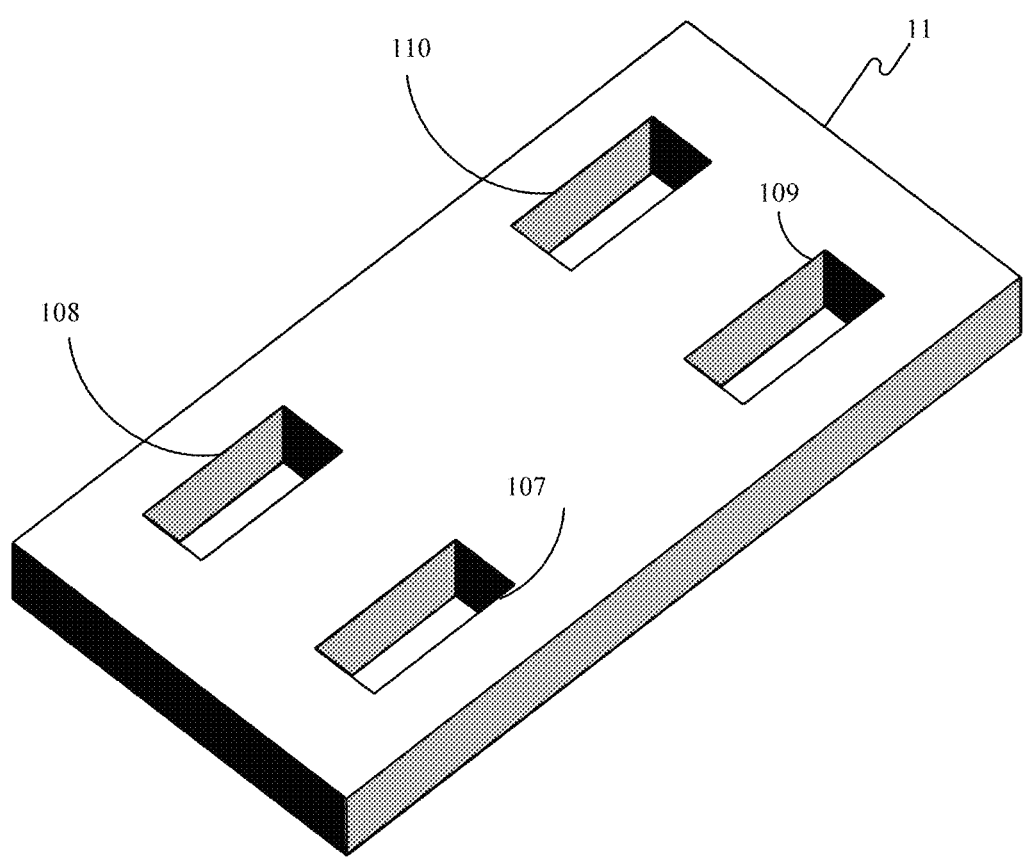

FIG. 5 shows an optoelectronic device similar to the one shown in FIG. 3. In the device shown in FIG. 5, the transparent layer 1 has been replaced by transparent items 105 and 106, located over the absorption and emission layers, respectively, and an opaque element 11 between the transparent items 105 and 106. In a preferred embodiment, FIG. 5 depicts two optoelectronic elements that are part of a planar array of optoelectronic elements, as described above for FIG. 3. In such an embodiment, it is preferred that opaque element 11 is an item that covers the array with an opaque layer. Such an embodiment of opaque element 11 is shown in a top view in FIG. 6 and in an oblique view in FIG. 7. The opaque element 11 has through holes 107, 108, 109, and 110, each of which is preferably located above an emission layer or an absorption layer. The through holes 107, 108, 109, and 110 may be empty of any solid material or may contain one or more transparent solid.

Materials suitable for opaque element 11 in FIG. 5 are the same as those for opaque element 10 in FIG. 4.

It is contemplated that, in the operation of some embodiments of the device shown in FIG. 5, light paths similar to paths 9 in FIG. 3 (not shown in FIG. 5) do not carry sufficient intensity of light to cause generation of significant photocurrent by the absorption layer 3302. It is contemplated that in such embodiments, the benefits of the present invention will be obtained from the presence of the opaque element 11 and that further opaque elements will not be needed.

The optoelectronic device of the present invention is useful for a wide variety of purposes. Preferably a planar array of optoelectronic elements is formed. Such an array would be useful as part of a display screen, for example in the display screen for a computer or a smartphone.

When put to use, the optoelectronic device connected to circuitry that provides bias for each optoelectronic element. In some embodiments, some optoelectronic elements are put under effective forward bias, while other optoelectronic elements are put under effective reverse bias, and each optoelectronic element maintains its bias for the duration of the task for which the device is used. In other embodiments, each optoelectronic element is put under a bias, and that bias on one or more elements may be changed, either by a human operator or automatically as the circuitry responds to some stimulus such as, for example, a timer or light falling on an effectively reverse biased optoelectronic element and creating a photocurrent.

In some embodiments, one or more optoelectronic element is put under a bias that switches continually from effective forward bias to effective reverse bias and back, repeatedly. Preferably, the switching is done frequently enough so that the human eye does not perceive that the optoelectronic element is alternately emitting and being dark; preferably the human eye perceives that the optoelectronic element is continuously emitting. Preferred switching rate is 20 Hz or faster; more preferably 50 Hz or faster; more preferably 100 Hz or faster; more preferably 200 Hz or faster; more preferably 500 Hz or faster. In such embodiments, a single optoelectronic element could serve both as a display element while it is emitting and as a detector for incident light while it is not emitting, and the human observer would perceive that the element was performing both functions simultaneously.

One preferred use for an optoelectronic device of the present invention is for detecting the presence of an object external to the device but in proximity to the device. Such a function would be useful, for example, for detecting the presence of a finger or other object such as a stylus to signal a "touch" at a specific location on a touchscreen. As depicted in FIG. 4, a touchscreen preferably contains an array of optoelectronic elements, some of which are effective forward biased to emit light, while others are effective reverse biased. The control circuitry chooses which optoelectronic elements to be put into effective forward bias and to emit light. For example, the optoelectronic elements arranged in the shape of a "button" could be effective forward biased to emit light, thus appearing to the viewer as a button. Near the light-emitting optoelectronic elements and in close proximity, preferably there are optoelectronic elements in effective reverse bias.

One method of using the optoelectronic device of the present invention for the detection of an external object is the "reflection" method. In the reflection method, when an external object 21 such as, for example, a stylus, a finger, or some other part of a human hand, approaches the device, when the external object approaches closely enough, light emitted by the effective forward biased elements reflects or scatters from the external object and returns to strike one or more of the effective reverse biased elements. The effective reverse biased element then generates photocurrent, which is detected by the current detection circuit, and the computer or smartphone responds to the "touch" on the "button." In the reflection method of detecting an external object, it is contemplated that light emitted by one or more of the effective forward biased elements, after being reflected or scattered by the external object, may be detected by one or more effective reverse biased elements, and ideally by two or more reverse biased elements.

When the reflection method of detecting an external object is used, it is preferred that the optoelectronic device includes an opaque element as described in the first aspect of the present invention. Examples of external objects include fingers, other parts of human hands, arms, a stylus, a mechanical arm, and a stencil.

It is contemplated that an advantage of the reflection method of detecting an external object is that the external object need not come into physical contact with the optoelectronic device. Preferably, the device of the present invention is configured so that an external object will scatter or reflect light from the device back into the device when the external object is at a distance of 0.1 mm to 5 mm.

Another method of using the optoelectronic device of the present invention is the "shadow" method. In the shadow method, the optoelectronic device is operated in an environment with relatively bright external lighting. The external lighting will include wavelengths of light to which photocurrent-generating elements in the optoelectronic device are sensitive. The external light will be sufficiently intense that optoelectronic elements that are in the optoelectronic device and that are in detection mode will be generating photocurrent. Under such conditions, many optoelectronic elements in the array will be in detection mode and will be continuously detecting photocurrent. When an external object approaches the surface of the optoelectronic device, the object will cast a shadow on the surface of the optoelectronic device. When the shadow falls on an optoelectronic element in detection mode, the photocurrent from that optoelectronic element will drop, and the drop in the photocurrent can be detected by the circuitry attached to the optoelectronic device. When such a drop occurs, the circuitry can cause a response. For example, when the drop in photocurrent occurs in one or more optoelectronic elements that are near a "button," the computer or smartphone can respond as if there had been a "tap" on that button.

It is contemplated that an advantage of the shadow method of detecting an external object is that the external object need not come into physical contact with the optoelectronic device. Preferably, the device of the present invention is configured so that when the external object is at a distance of 0.1 mm to 5 mm, the external object will block sufficient ambient light to cause the optoelectronic device to detect a drop in photocurrent of one or more optoelectronic elements.

Detection of an external object may be accomplished by a variety of embodiments of the present invention. For example, in a homogeneous arrangement, the device emitting elements and the absorbing elements may be identical to each other, with the only difference being in the bias voltage. Such a homogeneous embodiment has the advantage of manufacturing simplicity. Alternatively, in a heterogeneous arrangement, some optoelectronic elements that have relatively large band gap may be used as emitting elements, while some optoelectronic elements of somewhat smaller band gap may be used as detecting elements. An optoelectronic element typically has a peak wavelength of emitted light under effective forward bias that is somewhat shorter that the wavelength of light to which it is most sensitive in effective reverse bias. Therefore a heterogeneous arrangement could be designed to match the peak wavelength of the emitted light to the wavelength of highest sensitivity of the detecting element.

Another embodiment in which an external object is detected is an embodiment in which the optoelectronic device contains plural identical optoelectronic elements, including plural effective forward biased optoelectronic elements and plural effective reverse biased elements. Light emitted by the effective forward biased optoelectronic elements could be reflected or scattered by an external object, and the reflected or scattered light could be detected by one or more of the optoelectronic elements that are effective reverse biased.

Another preferred use of the device of the present invention is for the detection of a specific light source such as, for example, a laser or a light emitting diode (LED). The specific light source may be a handheld light source, for example, a laser pointer, an handheld LED, a light wand, a stylus with an illuminated tip, a toy light gun, an illuminated wand, or an illuminated glove. Any specific light source will have an emission spectrum of emitted light intensity versus optical frequency. The optical frequency that gives the maximum light intensity emitted by the specific light source is vs, the characteristic frequency of the specific light source.

The optoelectronic elements in the optoelectronic device of the present invention could be configured, either in their composition or in the detection circuitry, to respond to a specific light source. The detection optoelectronic elements could discriminate against other light sources, such as ambient lighting, by any means, including, for example, intensity, color, polarization, or a combination thereof. When the specific light source strikes a detecting optoelectronic element, the associated circuitry could, for example, switch the detecting element that had been struck by the specific light source from effective reverse bias to effective forward bias, thus switching that element from detection mode to emission mode. Then the array would emit light from those specific elements that had been struck by the specific light source. Thus a person could draw on a screen from a long distance by moving a laser pointer across the screen, and the person's gestures would become an image displayed on the screen. The same effect could be obtained by circuitry that caused optoelectronic elements in close proximity to those struck by the specific light source to be switched into emission mode, whether or not the optoelectronic element that had been struck by the specific light source was also switched to emission mode.

Preferably, the characteristic optical frequency of the specific light source $v_s$ is higher than the characteristic optical frequency $v_d$ of the effective reverse biased optoelectronic elements in the optoelectronic device.

The following are examples of the present invention.

Test methods were as follows.

Responsivity was measured as follows. A 1 mm radius and 532 nm wavelength laser was incident through an optical attenuator to vary the light intensity from 10 µW to 100 mW. The optical power of incident light was calibrated using an integrating sphere photodiode power sensor (Thorlabs, S140). I-V characteristics were obtained using a source meter (Keithley, 2602).

The spectral response was measured as follows. Photocurrent at different wavelength were measured by a digital lock-in amplifier (Stanford Research Systems, SR830) with monochromatic illumination provided by a Xeon lamp passed through a monochromator (Jobin Yvon Horiba, FluoroMax-3). A bias of 0V or −2V was applied to LR-LED devices by the source meter and the illumination was mechanically chopped at approximately 100 Hz. The intensity of illumination at each wavelength was calibrated using a calibrated Si photodetector (Newport 71650).

LED characteristics were recorded using a spectroradiometer (Spectrascan, PR-655) coupled with a source meter (Keithley, 2602). EQE was calculated as the ratio of the number of photons emitted to the number of electrons injected. Current and power efficiencies were obtained as the ratio of the output luminance to the driving current density and the ratio of the luminous flux output to the driving electrical power, respectively. All device measurements were performed in air.

Temporal frequency response was measure by shining activating laser light through an amplitude modulator operating at frequency f on a photodiode having DHNR as the active material. The photocurrent generated by the DHNR-PD was detected by a lock-in amplifier coordinated with the modulator. The photocurrent signal strength was measured as a function of modulator frequency. The photocurrent signal was approximately constant over the modulator frequency range of 10 Hz to 1000 Hz. As the modulator frequency was increased above 1,000 Hz, the photocurrent signal increased by approximately 5 dB and then, as the frequency continued to increase, the photocurrent signal fell steeply. The modulator frequency at which the photocurrent fell to 3 dB below the signal obtained at 10 Hz (that is, the observed photocurrent fell to a value equal to or less than 0.707 times the photocurrent value at 10 Hz) was labeled $f_{3\ db}$. The response time of the PD is $1/f_{3\ db}$. Two different wavelengths of activating laser light were used: 730 nm and 400 nm.

PREPARATIVE EXAMPLE 1

Quantum Dot Synthesis

The reactions were carried out in a standard Schlenk line under $N_2$ atmostsphere. Technical grade trioctylphosphine oxide (TOPO) (90%), technical grade trioctylphosphine (TOP) (90%), technical grade octylamine (OA) (90%), technical grade trioctylamine (TOA) (90%), technical grade octadecene (ODE) (90%), CdO (99.5%), Zn acetate (99.99%), S powder (99.998%), and Se powder (99.99%) were obtained from Sigma Aldrich. ACS grade chloroform, and methanol were obtained from Fischer Scientific. All chemicals were used as received.

The Synthesis of Red Quantum Dots

Red CdSe/CdS/ZnS were prepared in a manner similar to established methods [Lim, J. et al. Preparation of highly luminescent nanocrystals and their application to light-emitting diodes. Adv. Mater. 19, 1927-1932, 2007]. 1.6 mmol of CdO powder (0.206 g), 6.4 mmol of OA and 40 mL of TOA in a 200 ml three-neck round-bottom flask were degassed at 150° C. for 30 min under vacuum. Then, the solution heated to 300° C. under $N_2$ atmosphere. At 300° C., 0.4 mL of 1.0 M TOP:Se which was previously prepared in glove box was swiftly injected into the Cd-containing reaction mixture. After 45 sec, 1.2 mmol of n-octanethiol dissolved in 6 ml of TOA was slowly injected at a rate of 1 mL $min^{-1}$ via a syringe pump. The reaction mixture was then allowed to stir for an additional 30 min at 300° C. Simultaneously, 16 ml of 0.25 M Zn-oleate solution dissolved in TOA was prepared in a separate reaction flask with Zn acetate. the Zn-oleate solution were slowly injected into the CdSe reaction flask, following by injecting 6.4 mmol of n-octanethiol dissolved in 6 ml of TOA at a rate of 1 mL $min^{-1}$ using a syringe pump.

The Synthesis of Green Quantum Dots

Green CdSe/ZnS (gradient composition shell) quantum dots were prepared in a manner with a similar to established methods. [Bae, W. et al Highly Efficient Green-Light-Emitting Diodes Based on CdSe/ZnS Quantum Dots with a Chemical-Composition Gradient, Adv. Mater. 21, 1690-1694, 2009] 0.2 mmol of CdO, 4 mmol of Zn acetate, 4 mmol of OA and 15 ml of ODE were prepared in 100 ml three-neck round-bottom flask, degassed at 120° C. for 30 min under vacuum. The solution heated to 300° C. under $N_2$ atmosphere. At 300° C., 0.1 mmol of Se and 3.5 mmol of Se dissolved in 2 ml of TOP was swiftly injected into the reaction flask using a syringe. The reaction solution was then allowed to stir for an additional 10 min at 300° C., before being rapidly cooled by an air jet.

PREPARATIVE EXAMPLE 2

Bi-Directional Screen Fabrication

For the spin-coated QD LED/photodetector (PD), the devices were fabricated on ITO-coated glass substrates (sheet resistance of 15~25Ω/□). The pre-patterned ITO substrates were cleaned with acetone and isopropanol, consecutively, and then treated with UV-ozone for 15 min. PEDOT:PSS (Clevios™ P VP AI 4083) was spin-coated onto the ITO at 4000 rpm and baked at 120° C. for 5 min in air and 180° C. for 15 min in a glove box. Then TFB (H.W. Sands Corp.) was spin-coated using m-xylene (5 mg/ml) at 3000 rpm, followed by baking at 180° C. for 30 min in a glove box. After washing twice with chloroform and methanol mixture (1:1 volume ratio), QDs were finally dispersed in chloroform solution (~30 mg/ml), and spin-cast on top of the TFB layer at 2000 rpm and then subsequently annealed at 180° C. for 30 min.

ZnO (30 mg/ml in butanol for ZnO) was spin-coated at 3000 rpm and annealed at 100° C. for 30 min. ZnO nanoparticles were synthesized following the literature [J. Mater. Chem. 18, 1889-1894 (2008)]. In brief, a solution of potassium hydroxide (1.48 g) in methanol (65 ml) was added to zinc acetate dihydrate (2.95 g) in methanol (125 ml) solution and the reaction mixture was stirred at 60° C. for 2 h. The mixture was then cooled to room temperature and the precipitate was washed twice with methanol. After ETL spin-casting, 100 nm thick Al cathode was deposited by an electron-beam evaporator at a rate of 1 Å/s. The final product of QD LED and QD PD were combined together using a carbon tape (TED Pella, INC) (FIG. 3). Since the carbon tape was placed on the interface of the QD LED and the QD PD, green light could not be transferred from the green QD LED to the red QD PD through the transparent glass substrate.

EXAMPLE 3

Demonstration of Detection of External Object Using the Bi-Directional Screen of Example 2

Figure 10:
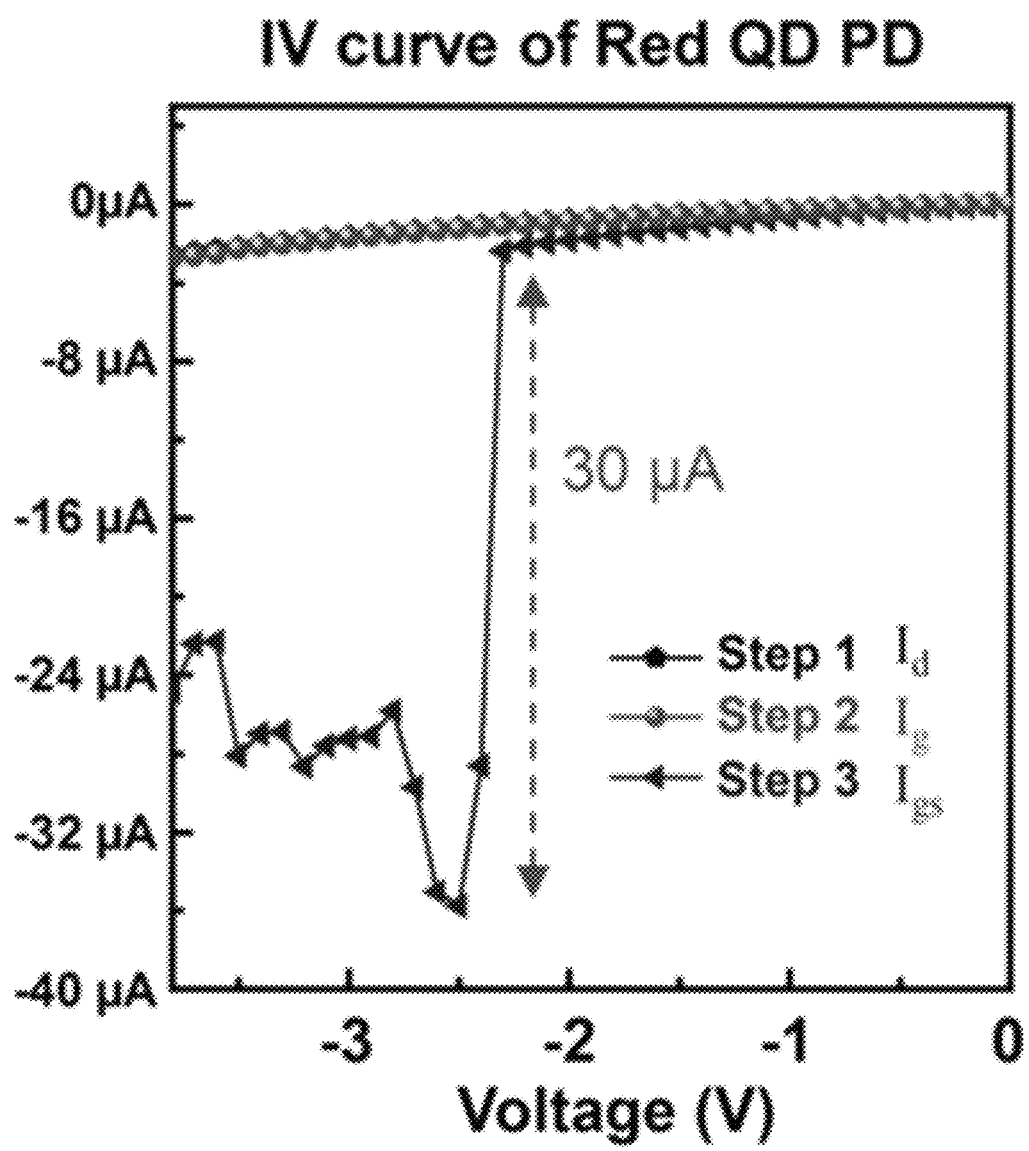
FIG. 10 shows the photocurrent generated by the device described in Example 3 that demonstrates detection of an external object.
Figure 11A:
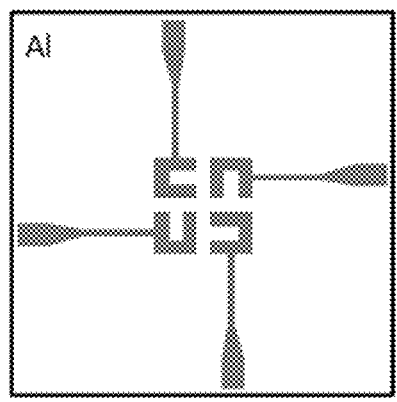
FIG. 11A through FIG. 11E show the steps used in constructing the 4×4 array of optoelectronic elements that is described in the Examples below.
Figure 11B:
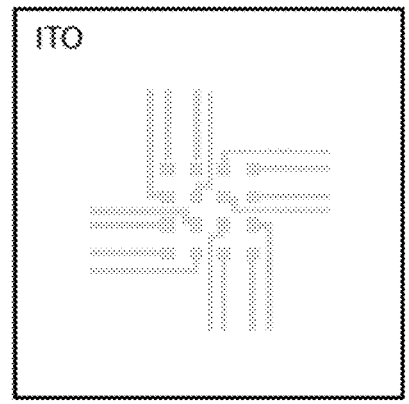
Figure 11C:
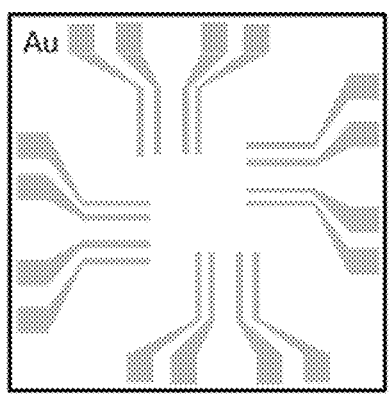
Figure 11D:
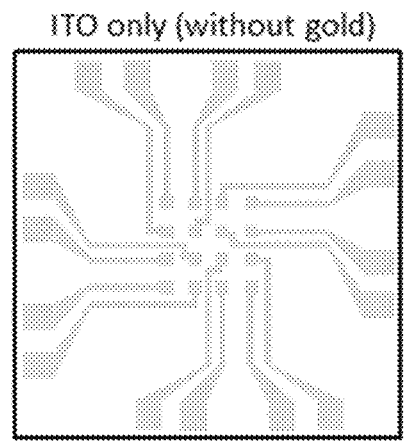
Figure 11E:
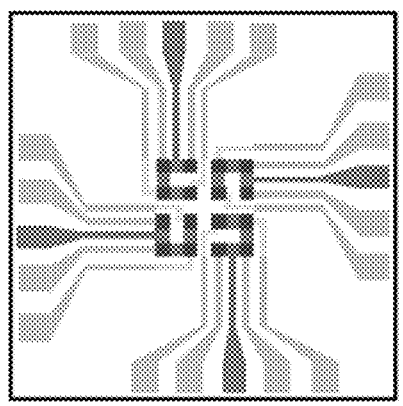

FIG. 10 shows the experimental results. The graph shows the dark current flow in the red QD PD. In step 1, an effective reverse bias is applied only on the red QD pixel to turn only the red QD PD on. At −2V the red QD PD has a current of about 4 micro ampere. In step 2, an effective forward bias is applied on the green QD pixel to turn the green QD LED on. Since the QD pixels are optically isolated, the red QD PD has a same current of 4 micro ampere as in step 1. In step 3, a 4-inch silicon wafer is placed 5 mm in front of the bi-directional touch screen. At this point, the current in the red PD is 30 micro ampere which is eight times bigger. This is because the green light from the green QD LED reflects from the surface of the silicon wafer and hits the red QD PD, giving it an additional increase in current. In conclusion, bi-directional touch screen was able to detect the silicon wafer located 5 mm in front of it.

A comparative device was also tested in which no opaque element was present. When the green QD LED was emitting light, the red QD PD was generating photocurrent, even when no external object was present. When an external object was present, the photocurrent from the red QD PD was not significantly larger than the photocurrent in the absence of the external object. It is considered that in the comparative device, a significant amount of light from the green QD LED reached the red QD PD via one or more direct pathway (i.e., a pathway that did not require reflection or scattering from an external object).

Device measurements were performed in dark to exclude the effect of an external light source.

PREPARATIVE EXAMPLE 4

Synthesis of Nanorods

Synthesis of CdS nanorod (NR) seeds: First, 2.0 g of trioctylphosphine oxide (TOPO), 0.67 g of octadecylphosphonic acid (ODPA) and 0.128 g of CdO in a 50 mL three-neck round-bottom flask were degassed at 150° C. for 30 min under vacuum and then heated to 370° C. under Ar. After Cd-ODPA complex was formed at 370° C., 16 mg of S dissolved in 1.5 mL of trioctylphosphine (TOP) was swiftly added into the flask with a syringe. Consequently, the reaction mixture was quenched to 330° C. where the CdS growth was carried out. After 15 min, CdS NR growth was terminated by cooling to room temperature. The final solution was dissolved in chloroform and centrifuged at 2000 rpm. The precipitate was re-dissolved in chloroform, and then prepared as a solution for the next step. This solution of CdS NRs had an optical density of 0.1 (for 1 cm optical path length) at the CdS band edge absorption peak when diluted by factor of 100.

Synthesis of CdS/CdSe nanorod heterostructure (NRH) seeds. Following the formation of CdS NRs and cooling the reaction mixture from 330° C. to 250° C., 20 mg of Se dissolved in 1.0 mL of TOP was slowly added at 250° C. at a rate of 4 ml/h via syringe pump (total injection time ~15 min). The reaction mixture was then allowed to stir for an additional 10 min at 250° C. before being rapidly cooled to room temperature. The final solution was dissolved in chloroform, and centrifuged at 2000 rpm. The precipitate was re-dissolved in chloroform, and then prepared as a solution for the next step. This solution of CdS/CdSe NRHs had an optical density of 0.1 (for 1 cm optical path length) at the CdS band edge absorption peak when diluted by factor of 100.

Synthesis of CdS/CdSe/ZnSe dual heterjunction nanorods (DHNRs). CdS/CdSe/ZnSe DHNRs were synthesized by growing ZnSe onto CdS/CdSe nanorod heterostructures. For Zn precursor, 6 mL of octadecene, 1.13 g (4 mmol) of oleic acid and 0.18 g (1.0 mmol) of Zn acetate were degassed at 150° C. for 30 min. The mixture was heated to 250° C. under $N_2$ atmosphere, and consequently Zn-oleate was formed after 1 h. Then, 2 mL of previously prepared CdS/CdSe stock solution was injected into Zn-oleate solution after cooling to 50° C. Chloroform was allowed to evaporate for 30 min under vacuum at 70° C. ZnSe growth was initiated by a slow injection of the Se precursor containing 18.5 mg (0.25 mmol) of Se dissolved in 1.0 ml of TOP to the reaction mixture during heating from 180° C. to 300° C. Thickness of ZnSe on CdS/CdSe nanorod heterostructures was controlled by the amount of Se injected. The ZnSe growth was terminated by removing the heating mantle after injecting the desired amount of Se precursor. The resulting nanorods had structure depicted in FIG. 8.

Individual optoelectronic elements involving nanorods were constructed having the following layers: glass; ITO; PEDOT:PSS mixture; TFB:$F_4$TCNQ mixture; NR layer; ZnO, Aluminum.

EXAMPLE 5

Characteristics of Optoelectronic Elements

The characteristics of the individual optoelectronic elements were determined as described above. In the table below, an individual optoelectronic element containing nanorods is referred to as a "NR-LED," and an individual optoelectronic element containing quantum dots is referred to as a "QD-LED." The NR-LED and QD-LED were compared to various light-emitting diodes (LEDs) in which the absorption/emission material is an organic compound or mixture of organic compounds (organic light-emitting diodes, or OLEDs), according to the results published in the following reference publications:

Ref 1. Organic bifunctional devices with emission and sensing abilities, *Japanese Journal of Applied Physics* 46, 1328 (2007)

Ref 2. Integrated organic blue led and visible-blind uv photodetector, *Journal of Physical Chemistry C* 115, 2462 (2011)

Ref 3. High performance organic integrated device with ultraviolet photodetective and electroluminescent properties consisting of a charge-transfer-featured naphthalimide derivative, *Applied Physics Letters* 105, 063303 (2014)

Ref 4. High performance organic ultraviolet photodetector with efficient electroluminescence realized by a thermally activated delayed fluorescence emitter, *Applied Physics Letters* 107, 043303 (2015)

Ref 5. High Efficiency and Optical Anisotropy in Double-Heterojunction Nanorod Light-Emitting Diodes, *ACS Nano* 9, 878 (2015)

|  | Emitter Material | Responsivity Results (mA/W) | Responsivity Measurement Conditions | Absorption Range for Photodetection |
|---|---|---|---|---|
| OLED in Ref. 1 | CuPc/PPR | N/A | with Xe light (no power info) | N/A |
| OLED in Ref. 2 | P2NHC | 3 (at −2.5 V) 77 (at −16 V) | with 390 nm (no power info) | 300-420 nm |
| OLED in Ref. 3 | CzPhONI | ~139 (at −3 V) | with 350 nm (0.6 mW/cm$^2$) | 300-420 nm |
| OLED in Ref. 4 | TCTA | 127 (at −2.5 V | with 350 nm (0.2-12.4 mW/cm$^2$) | N/A |
| NR-LED | DHNR | 108 (at 0 V) | with 405 nm laser | 300-780 nm |

-continued

| | | | | |
|---|---|---|---|---|
| QD-LED | CdSe/CdS/ZnS | 183 (at −2 V)<br>10 (at 0 V)<br>30 (at −2 V) | (100 mW/cm$^2$)<br>with 405 nm laser<br>(100 mW/cm$^2$) | 300-780 nm |

| | Luminance (cd/m$^2$) | Max Luminous Current/Power Efficiency | Comments |
|---|---|---|---|
| OLED in Ref. 1 | 1 at 5 V, Blue<br>1000 at 10 V<br>(Max L: 9720) | N/A | Dual functioning<br>16 × 16 Passive matrix |
| OLED in Ref. 2 | 500 at 4 V, Blue<br>16000 at 9 V | 2.2 cd/A<br>4.9 lm/W | No TPD contribution |
| OLED in Ref. 3 | 50 at 5 V, Blue<br>1400 at 10 V | 0.33 cd/A | Broad EL spectrum<br>200 ms rise time |
| OLED in Ref. 4 | 100 at 5 V, Blue<br>10000 at 10 V<br>(Max L: 27000) | 8.2 cd/A<br>4.9 lm/W | Broad EL spectrum<br>200 ms rise time |
| NR-LED | 3000 at 3 V, Red<br>30000 at 10 V<br>(Max L: 76000 | 27.5 cd/A<br>36.5 lm/W | LED Efficiencies from Ref 5.<br>~0.2 ms rise time |
| QD-LED | 1500 at 3 V, Red<br>10000 at 10 V<br>(Max L: 23000 | 7.8 cd/A<br>8.9 lm/W | Efficiencies from Ref 5.<br>~1 ms rise time |

In the table above, it is noted that both QDs and NRs have superior absorption range, luminance, and rise time as compared to the various OLEDs. Further NRs are superior to QDs in responsivity and rise time.

EXAMPLE 6

Response Times of Devices Made with Nanorods

Individual PDs were made using NR as described above. Response times were measured as described above. Results were as follows:

Nanorod PD Response Times

| Laser wavelength | f3dB | response time |
|---|---|---|
| 730 nm | 5500 Hz | 0.18 ms |
| 400 nm | 10 kHz | 0.1 ms |

EXAMPLE 7

4×4 Array of Optoelectronic Elements

An array of 16 optoelectronic elements in a 4×4 square array was fabricated as follows. As shown in FIGS. 11A through 11E, the device was fabricated on patterned indium tin oxide (ITO) on glass substrates. PEDOT:PSS (Clevios P VP AI 4083) conductive polymer was coated onto ITO at 4000 rpm and annealed at 120 C in air for 5 minutes. The device were transferred into a glove box and annealed at 180 C for 20 minutes. Then, 7 mg/mL solution of TFB/F4TCNQ mixture dissolved in m-xylene was spin-coated at 3000 rpm and annealed at 180 C for 30 minutes. Nanorods (synthesized as described above) (60 mg/mL) in chloroform after washing twice with 1:1 volume ratio of chloroform and methanol was spin coated at 2000 rpm, then subsequently annealed at 180 C for 30 minutes. 30 mg/mL solution of ZnO in butanol was then spin-coated at 3000 rpm and annealed at 100 C for 30 minutes. A 100 nm thick Al cathode was then deposited by electron-beam evaporation technique. The device was encapsulated with a cover glass using epoxy (NOA 86) in a glovebox.

The commercially available Arduino Uno and Mega (Arduino company) were used to control the devices for bidirectional display application. In addition to applying effective forward bias to turn on LED devices with the Arduino, it can measure the photocurrent and relay trigger signals from the external light sources. The board can be programmed with the Arduino Integrated Development Environment (IDE) software.

EXAMPLE 8

Demonstration of Detection of Specific Light Source with a 4×4 Array

The specific light source was a green laser. Initially, all sixteen optoelectronic elements were put into effective reverse bias. The associated circuitry was arranged so that, when the current detector for a specific optoelectronic element detected current, the bias would flip from effective reverse bias to effective forward bias and remain in effective forward bias for 1 second before flipping back to effective reverse bias. When the laser was turned on and aimed at of one of the optoelectronic elements, that element began to glow with yellow light and remained glowing for 1 second before becoming dark again. As the pen was moved from one optoelectronic element to the next, the optoelectronic element on which the laser's light fell glowed and stayed glowing for one second. The motion of the pen traced out several patterns, for example, a triangle of three of the four optoelectronic elements, and the array of optoelectronic elements emitted light in the same pattern for 1 second before returning to a dark state.

The invention claimed is:
1. An optoelectronic device comprising a planar array of optoelectronic elements and circuitry connected to the optoelectronic element,
   wherein the optoelectronic element comprises an active layer, wherein the active layer comprises plural quantum dots or plural nanorods, and wherein the circuitry is configured to be capable of switching the optoelectronic element between a configuration in which the circuitry provides an effective forward bias voltage that causes the optoelectronic element to emit light and a configuration in which the circuitry provides an effective reverse bias voltage that causes the optoelectronic element to be capable of generating a photocurrent when light to which the optoelectronic element is sensitive strikes the optoelectronic element, wherein the optoelectronic device further comprises an opaque element that prevents light emitted by the light-emitting optoelectronic elements from reaching the photocurrent-generating optoelectronic elements via a pathway within the device, wherein the opaque element is an item that covers the array with an opaque layer having through holes, each of which is located above the active layer of the optoelectronic elements.

2. The optoelectronic device of claim 1, wherein the optoelectronic element comprises plural nanorods.

3. The optoelectronic device of claim 1, where the optoelectronic element comprises one or more heterojunctions.

4. The optoelectronic device of claim 1, wherein the bias voltage is alternated between a voltage which produces a light emitting state and a voltage which produces a light detecting state at a frequency of at least 20 Hz.

5. The optoelectronic device of claim 4 wherein the alternating bias voltage frequency is rapid enough to appear visually to be in a constant light emitting state.

* * * * *